(12) United States Patent
Ijitsu

(10) Patent No.: US 7,843,210 B2
(45) Date of Patent: Nov. 30, 2010

(54) SEMICONDUCTOR INTEGRATED CIRCUIT DEVICE AND TESTING METHOD OF THE SAME

(75) Inventor: Kenji Ijitsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/656,696

(22) Filed: Feb. 12, 2010

(65) Prior Publication Data
US 2010/0148816 A1    Jun. 17, 2010

Related U.S. Application Data

(63) Continuation of application No. PCT/JP2007/068257, filed on Sep. 20, 2007.

(51) Int. Cl.
*H03K 19/00*    (2006.01)
*G01R 31/28*    (2006.01)

(52) U.S. Cl. .............................. 326/16; 326/38; 714/726

(58) Field of Classification Search .................... 326/16, 326/37, 38; 714/724, 726
See application file for complete search history.

(56) References Cited

U.S. PATENT DOCUMENTS

| | | |
|---|---|---|
| 5,960,008 A | 9/1999 | Osawa et al. |
| 7,007,215 B2 * | 2/2006 | Kinoshita et al. ............ 714/745 |
| 2004/0213058 A1 * | 10/2004 | Shimizu et al. .............. 365/200 |

FOREIGN PATENT DOCUMENTS

| | | |
|---|---|---|
| JP | 1-267475 | 10/1989 |
| JP | 10-073641 | 3/1998 |
| JP | 11-3243 | 1/1999 |
| JP | 11-101858 | 4/1999 |

OTHER PUBLICATIONS

International Search Report for PCT/JP2007/068257, mailed on Dec. 4, 2007.

* cited by examiner

*Primary Examiner*—Daniel D Chang
(74) *Attorney, Agent, or Firm*—Staas & Halsey LLP

(57) ABSTRACT

A disclosed semiconductor integrated circuit device includes a logic circuit, a memory circuit to which data are written by the logic circuit and from which the data are read by the logic circuit, a register circuit holding the data when the logic circuit writes the data to the memory circuit, and a selector circuit selecting one of data output from the register circuit and data output from the memory circuit, and outputting the selected data to the logic circuit. Further in the semiconductor integrated circuit device, in an operational test of the logic circuit, the selector circuit selects the data output from the register circuit and outputs the selected data to the logic circuit.

8 Claims, 8 Drawing Sheets

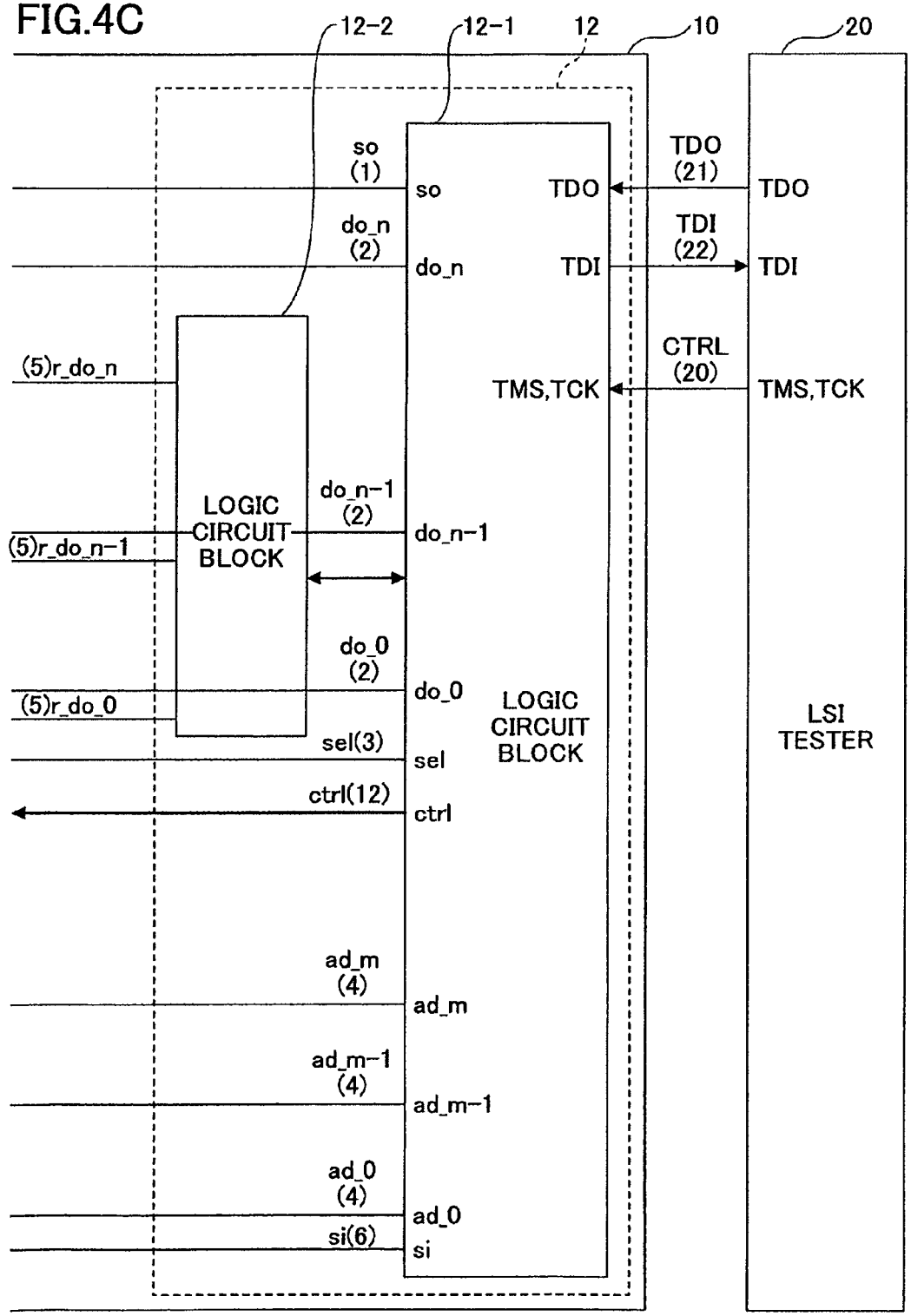

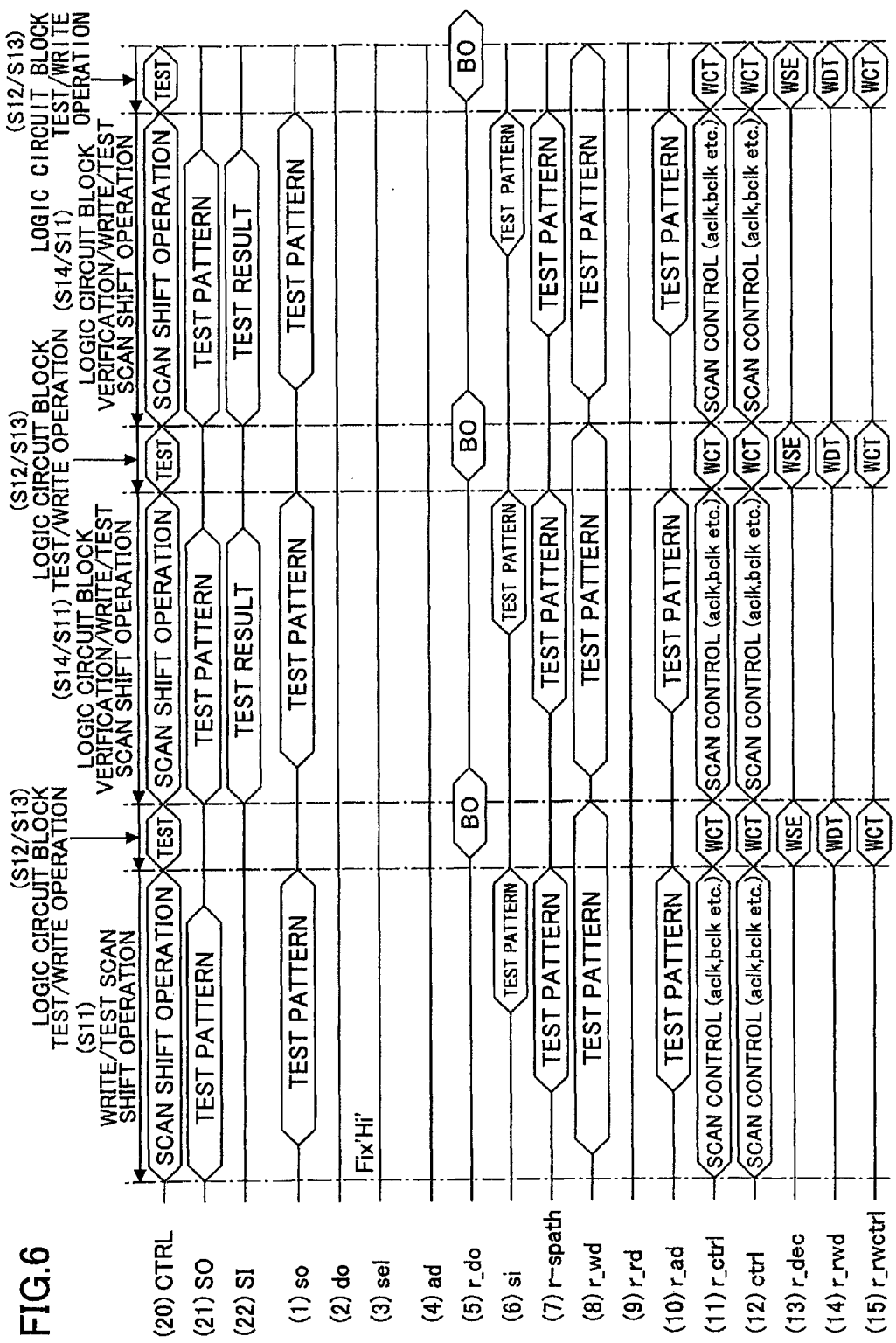

US 7,843,210 B2

SEMICONDUCTOR INTEGRATED CIRCUIT DEVICE AND TESTING METHOD OF THE SAME

CROSS-REFERENCE TO RELATED APPLICATIONS

This application is U.S. continuation application claiming benefit under 35 USC 120 and 365(c) of PCT application JP07/068,257, filed on Sep. 20, 2007. The foregoing application is hereby incorporated herein by reference.

FIELD

The embodiment discussed herein is related to a semiconductor integrated circuit device and a testing method of the same.

BACKGROUND

Japanese Laid-Open Patent Application No. 11-3243 discloses a data processing unit capable of separately testing the microprocessor or the memory mounted in the multi-chip module. To that end, when output enable signals are active, and control signals are turned to a high level, the output enable signals input to the output enable terminal of the memory are inactivated and external output enable signals are activated. When secondary cache output enable signals are not active, the output enable signals are inactivated. Therefore, when the control signals are at the high level, since the memory does not perform output even in the read cycle of a secondary cache, the single body test of the microprocessor can be performed.

SUMMARY

According to an aspect of the present invention, there is provided a semiconductor integrated circuit device including a logic circuit, a memory circuit to which data are written by the logic circuit and from which the data are read by the logic circuit, a register circuit holding the data when the logic circuit writes the data to the memory circuit, and a selector circuit selecting one of data output from the register circuit and data output from the memory circuit, and outputting the selected data to the logic circuit. Further, in the semiconductor integrated circuit device, in an operational test of the logic circuit, the selector circuit selects the data output from the register circuit and outputs the selected data to the logic circuit.

The object and advantages of the disclosure will be realized and attained by means of the elements and combinations particularly pointed out in the claims.

It is to be understood that both the foregoing general description and the following detailed description are exemplary and explanatory and are not restrictive of the invention as claimed.

BRIEF DESCRIPTION OF DRAWINGS

FIGS. 4A through 4c are a second schematic block diagram collectively illustrating an exemplary configuration of a semiconductor integrated circuit device according to an embodiment of the present invention;

FIG. 6 is a testing time chart illustrating a case where the logic circuit block is tested by bypassing the memory cell array in testing the semiconductor integrated circuit device.

DESCRIPTION OF EMBODIMENT

Figure 1:
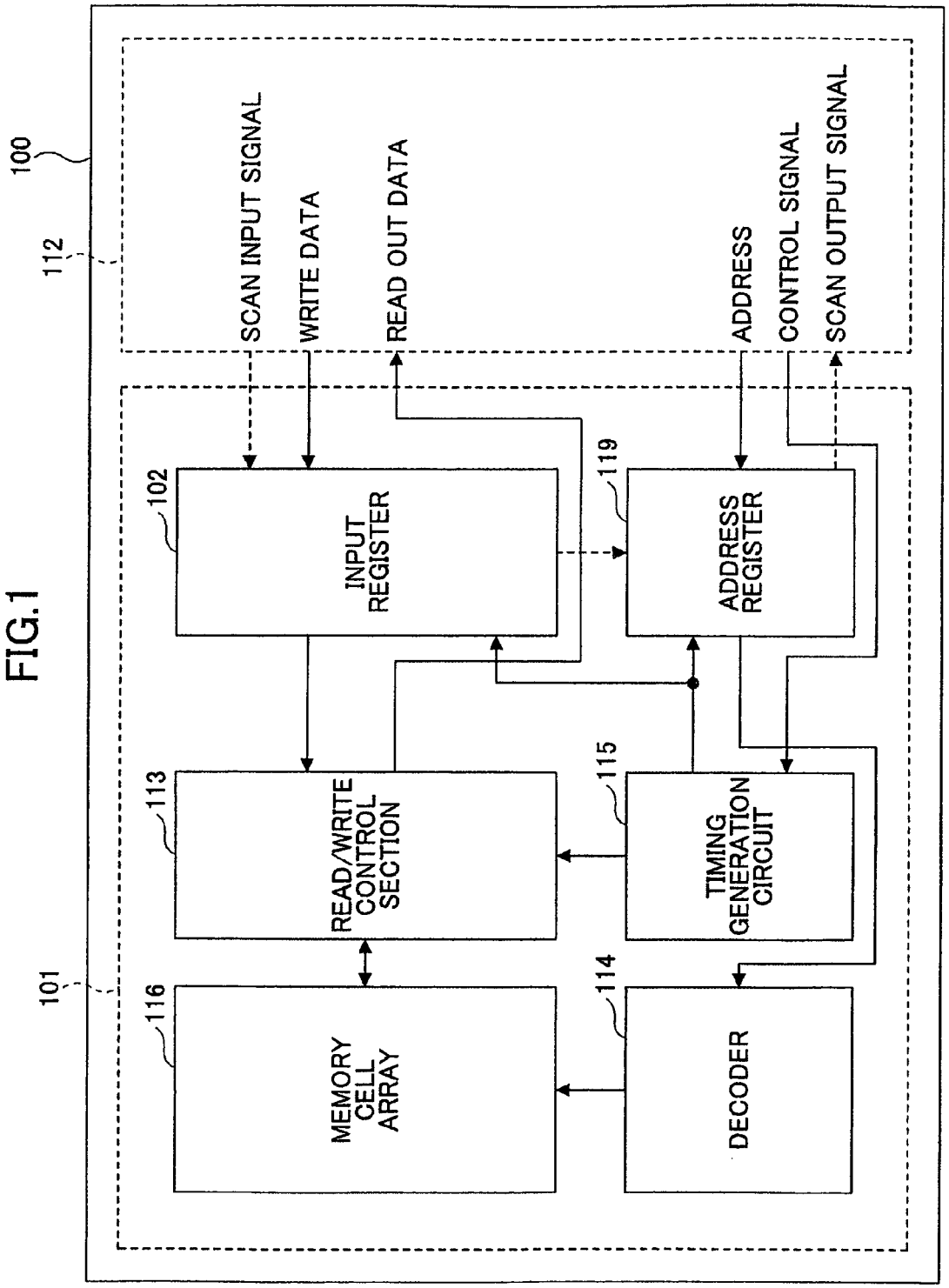
FIG. 1 is a schematic block diagram illustrating an exemplary configuration of a conventional semiconductor integrated circuit device.

FIG. 1 schematically illustrates an exemplary configuration of a conventional semiconductor integrated circuit device 100.

As illustrated in FIG. 1, the semiconductor integrated circuit device 100 includes a logic circuit block 112 performing plural logical operation functions, and a cache memory 101 being adequately used during, for example, the logical operation functions performed by the logic circuit block 112.

Further, the cache memory 101 includes a memory cell array 116, a read/write control section 113, an input register 102, an address register 119, and a timing generation circuit 115. The read/write control section 113 performs reading/writing operations of data from/to to the memory cell array 116. The input register 102 has a latch function to temporarily hold input data from the logic circuit block 112. The address register 119 holds an address of the memory cell array 116, the address being designated by the logic circuit block 112. The timing generation circuit 115 generates timing signals controlling operations timings of the read/write control section 113, the input register 102, and the address register 119.

In a functional test of the semiconductor integrated circuit device 100 having such a configuration as described above, especially when the functions of the logic circuit block 112 are being tested, results of operations of the logic circuit block 112 using data read out from the cache memory 101 are recorded. In this case, the read out data may be provided by fixing the data output from the cache memory 101 to be "1" or "0" or by performing the reading operation on the cache memory 101. Then, the functions of the circuit block 112 are tested by comparing the results of the operations with expected values.

As described above, in the functional test of the logic circuit block 112 of the semiconductor integrated circuit device 100, it is required to write arbitrary test data into the cache memory 101 in advance. However, it may take a certain period of time to write the test data into the cache memory 101.

Further, upon such a testing method as described above being employed, even when the cache memory 101 itself is faulty, the test result does not provide enough evidence to specify whether the circuit block 112 is faulty or the cache memory 101 is faulty.

Further, as described above, when the functional test of the logic circuit block 112 is performed by fixing the data output from the cache memory 101 to be "1" or "0", the functional test of the logic circuit block 112 that can be performed may be limited because the read out data are limited to a specific pattern(s). Because of this feature, it may be difficult to increase a fault detection rate of the logic circuit block 112.

In the following, an embodiment of the present invention is described with reference to the accompanying drawings.

Figure 2:
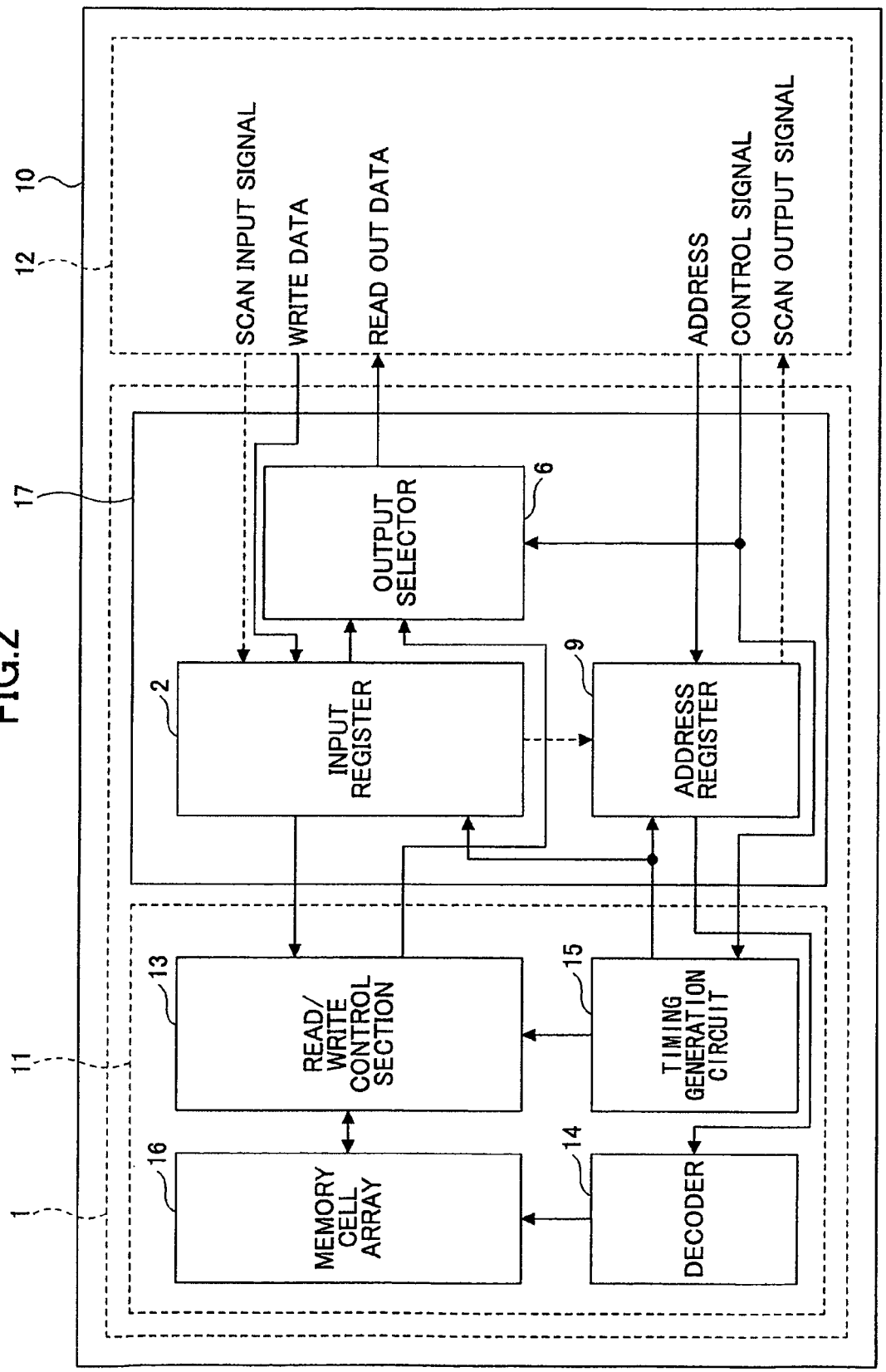
FIG. 2 is a first schematic block diagram illustrating an exemplary configuration of a semiconductor integrated circuit device according to an embodiment of the present invention.

FIG. 2 is a first block diagram illustrating an exemplary schematic configuration of a semiconductor integrated circuit 10 according to an embodiment of the present invention.

Next, data flows indicated by arrows in FIG. 2 are described.

In normal operation of the semiconductor integrated circuit 10, "write data" are supplied from a logic circuit block 12 to a read/write control section 13 via an input register 2. Then the "write data" are written to an address of a memory cell array 16, the address being designated by a decoder 14.

In this case, first, the address of the memory cell array 16 is supplied as "address" (i.e., address data) from the logic circuit block 12 and set in an address register 9. Then, the address is further supplied from the address register 9 to the memory cell array 16 via the decoder 14.

The data written as described above in the memory cell array 16 are then read out from an address of the memory cell array 16. In this case, the address is supplied as "address" from the logic circuit block 12 and set in the address register 9. Then, the address is further supplied from the address register 9 to the memory cell array 16 via the decoder 14. Then, the data read out from the address of the memory cell array 16 pass through an output selector 6 via the read/write control section 13, and are supplied as "read out data" to the logic circuit block 12.

In this case, the operations of the output selector 6 and a timing generation circuit 15 are controlled based on "control signals" supplied from the logic circuit block 12.

Further, the timing generation circuit 15 supplies clock signals to the input register 2, the address register 9, and the read/write control section 13 to control the operations thereof.

On the other hand, in testing the operations of the semiconductor integrated circuit 10, a scan input signal is supplied from the logic circuit block 12 to the input register 2. In this case, the scan input signal is sequentially shifted in the input register 2 and then in the address register 9 by a scan shift operation described below. Then, the shifted scan input signal is supplied as a scan output signal to the logic circuit block 12.

Further, test data are set in the input register 2 by performing the scan shift operation. Then, the test data set in the input register 2 are directly passed through the output selector 6 and supplied as the read out data to the logic circuit block 12 by bypassing (without being passed through) the read/write control section 13 and the memory cell array 16.

As illustrated in FIG. 2, the semiconductor integrated circuit device 10 includes the logic circuit block 12 performing plural logical operation functions (hereinafter may be simplified as logical operations or operations), and a cache memory 1 being adequately used during, for example, the operations performed by the logic circuit block 12.

Further, the cache memory 1 includes a register block 17 and a RAM core 11.

The RAM core 11 includes the memory cell array 16, the read/write control section 13, the timing generation circuit 15, and the decoder 14. The read/write control section 13 performs reading/writing operations of data from/to the memory cell array 16. The timing generation circuit 15 supplies clock signals to the read/write control section 13, the input register 2 and the address register 9 to control the operations thereof. The decoder 14 enables data to be read from and written to an address of the memory cell array 16 by decoding the address supplied from the address register 9 and then supplying the decoded address to the memory cell array 16.

Further, the register block 17 includes the input register 2 and the address register 9. The input register 2 has a latch function to temporarily hold input data from the logic circuit block 12. The address register 9 holds the address of the memory cell array 16, the address being designated by the logic circuit block 12. The register block 17 further includes the output selector 6.

When the semiconductor integrated circuit device 10 having a configuration as described above is integrated into a system to be operated in the system, the logic circuit block 12 uses the cache memory 1 upon performing the logical operations.

In such a semiconductor integrated circuit device 10, the logic circuit block 12 obtains data from an external storage device (not shown), and the obtained data are temporarily held in the input register 2. Then, the data are written to the memory cell array 16 via the read/write control section 13 of the cache memory 1. In this case, the logic circuit block 12 supplies the address of the memory cell array 16 to the address register 9, the address indicating the address to which the data are to be written in the memory cell array 16. As a result, the address register 9 holds the supplied address. Then, the address held in the address register 9 along with the write data held in the input register 2 are supplied to the RAM core 11 at the timing based on timing signals supplied from the timing generation circuit 15. As a result, the data supplied from the input register 2 are written to the address of the memory cell array 16 via the read/write control section 13, the address being supplied from the address register 9 and being decoded by the decoder 14. Such an operation as described above is called a write operation.

Then, when necessary, the data written in the memory cell array 16 are read out from the memory cell array 16, so that the logic circuit block 12 may perform adequate operations on the data.

In this case, the address of the memory cell array 16 is supplied from the logic circuit block 12 to the address register 9, the address indicating the address to which the data to be read have been written. As a result, the supplied address is held in the address register 9. Then, the address held in the address register 9 is output at the timing of the timing signal supplied from the timing generation circuit 15 and decoded by the decoder 14 to be supplied to the memory cell array 16. As a result, the data corresponding to the supplied address are read out from the memory cell array 16 via the read/write control section 13 to be supplied to the logic circuit block 12 via the output selector 6. Such an operation as described above is called a read operation.

As the data to be supplied to the logic circuit block 12, the output selector 6 selects one of the data held in the input register 2 and the data read from the memory cell array 16 via the read/write control section 13.

In the semiconductor integrated circuit device 10 according to an embodiment of the present invention, to improve test efficiency, test data (a.k.a. "test vector" or "test pattern") held in the input register 2 of the cache memory 1 may be directly supplied to the logic circuit block 12 without being written to the memory cell array 16.

Namely, the semiconductor integrated circuit device 10 according to an embodiment of the present invention has a specific feature in its data transmission method as described above.

More specifically, according to the configuration illustrated in FIG. 1, the data held in the input register 102 are written to the memory cell array 116 first. Then, the data written to the memory cell array 116 are read by the read/write control section 113, and supplied to the logic circuit block 112. On the other hand, according to an embodiment of the present invention, as illustrated in FIG. 2, due to the function of the output selector 6, the data held in the input register 2 can be directly supplied to the logic circuit block 12 via the output selector 6 without being passed through the read/write control section 13 and the memory cell array 16. Namely, the data held in the input register 2 can be directly supplied as the data read from the memory cell array 16 to the logic circuit block 12 without performing a process of reading data from the memory cell array 16.

That is, the data to be supplied as the read out data to the logic circuit block 12 via the read/write control section 13 and the memory cell array 16 can be directly supplied to the logic circuit block 12 by bypassing (without being passed through) the read/write control section 13 and the memory cell array 16 due to the function of the output selector 6. As a result, the logic circuit block 12 can treat the data received actually (directly) from the input register 2 via the output selector 6 as the data output from the memory cell array 16 via the read/write control section 13 based on an original operational procedure of the cache memory 1, and perform operations in accordance with the received data. As a result, it may become possible to test (simulate) the operations of the logic circuit block 12 using the original operational procedure of the cache memory 1.

Therefore, in the semiconductor integrated circuit device 10 according to an embodiment of the present invention, it may become possible to test the results of the operations of the logic circuit block 12 based on the data directly output from the input register 2 via the output selector 6 by bypassing the read/write control section 13 and the memory cell array 16 due to the function of the output selector 6.

As a result, in testing the operations of the logic circuit block 12, it may become possible to set arbitrary test data in the logic circuit block 12 by using the test data output directly from the input register 2 via the output selector 6 without operating the read/write control section 13, the memory cell array 16, and the decoder 14 in the RAM core 11 of the cache memory 1. Therefore, it may become possible to effectively perform testing the logic circuit block 12.

Figure 3:
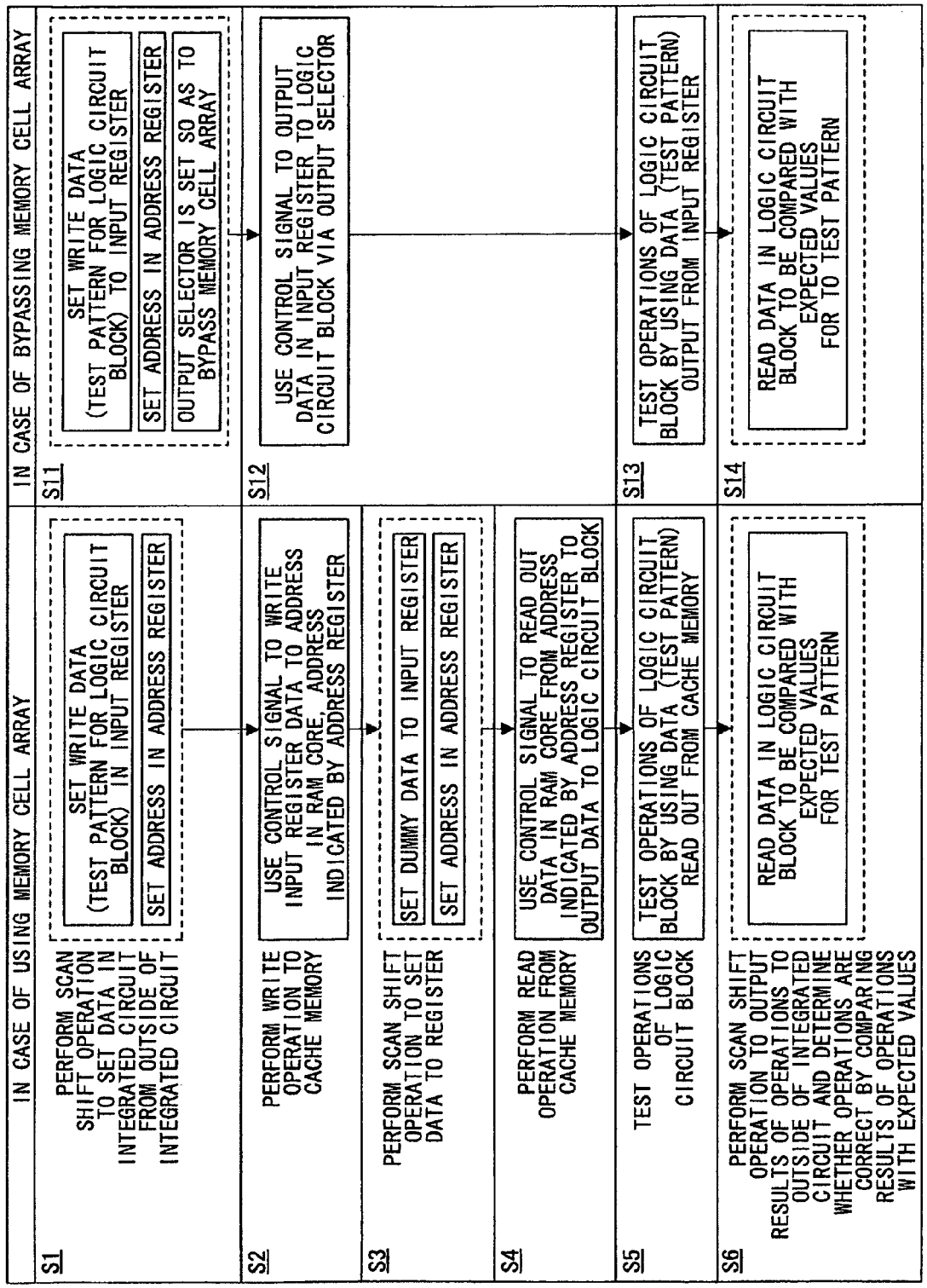
FIG. 3 is a drawing illustrating a comparison in operating procedures between a case where a logic circuit block is tested by using a memory cell array and a case where the logic circuit block is tested by bypassing (without using) the memory cell array to test the semiconductor integrated circuit device.

FIG. 3 illustrates a comparison in test procedures between a testing method performed by using the read/write control section 13 and the memory cell array 16 (steps S1 through S6) and a testing method performed by bypassing (without using) the read/write control section 13 and the memory cell array 16 (steps S11 through S14).

In those test procedures, it is assumed that the logic circuit block 12 includes a configuration necessary for performing a known scan test during the operational test of the logic circuit block 12.

As illustrated in FIG. 3, in the testing method performed by using the read/write control section 13 and the memory cell array 16 (steps S1 through S6), by performing a known scan shift operation, test data to be used for the operational test of the logic circuit block 12 are set in the input register 2 as the write data for the memory cell array 16, and the address corresponding to the write data is supplied from the logic circuit block 12 and set in the address register 9 (step S1).

Next, by performing the write operation, the test data set in the input register 2 in step S1 are written to the address of the memory cell array 16 via the read/write control section 13, the address having been set in the address register 9 in step S1 (step S2).

Next, by performing the scan shift operation similar to that in step S1, dummy data are set in the input register 2, and the address corresponding to the write data written in the memory cell array 16 in step S2 is set in the address register 9 (step S3).

Next, the reason why the dummy data are set in the input register 2 in step S3 is described.

As may be well known, the scan shift operation is the operation of setting data in plural registers connected in series. The setting is done in a manner such that, when data are input to a first register, the data having been held in the first register are pushed out to be shifted inside the first register and data pushed out from the first register are written to the next register so that data input in the first register are sequentially shifted throughout the registers connected in series. In a case of the circuit configured as illustrated in FIG. 2, data to be set by performing the scan shift operation (indicated as a scan input signal in FIG. 2) are input to the input register 2. As a result, data in the plural registers included in the input register 2 are sequentially shifted and transmitted in the registers and finally output from the input register 2. Then the data output from the input register 2 are input to the address register 9.

Because of this feature, to set the address in the address register 9 by performing the scan shift operation, the address to be set is input to the input register 2 first. Then to push out (output) the address from the input register 2 to be fed to the address register 9 in the scan shift operation, data are required to be input to the input register 2. The data used for pushing out data in the register are referred to as the dummy data.

Next, the read operation is performed. That is, the address set in the address register 9 in step S3 is decoded by the decoder 14, and the decoded address is supplied to the memory cell array 16. As a result, based on the address supplied to the memory cell array 16, the test data having been written to the memory cell array 16 by performing the write operation in step S2 are read from the memory cell array 16, and supplied to the logic circuit block 12 (step S4).

The logic circuit block 12 performs operations on the test data supplied as described above (step S5). Then, results of the operations are held in an internal register (not shown) of the logic circuit block 12.

Finally, by performing the scan shift operation, the results of the operations held in the internal register of the logic circuit block 12 are taken out (output) to be compared with expected values. Based on the result of the comparison, it is determined whether the operations of the logic circuit block 12 are correctly (adequately) performed (step S6).

On the other hand, in the testing method performed by bypassing (without using) the read/write control section 13 and the memory cell array 16, first, similar to step S1, by performing the scan shift operation, test data to be used for the operational test of the logic circuit block 12 are set in the input register 2 (step S11).

Next, the test data having been set in the input register 2 in step S11 are directly supplied to the logic circuit block 12 via the output selector 6, the test data being to be used for the operational test of the logic circuit block 12 (step S12).

Next, the logic circuit block 12 performs operations on the test data supplied from the input register 2 via the output selector 6 (step S13). The results of the operations are held in the internal register (not shown) of the logic circuit block 12.

Finally, by performing the scan shift operation, the results of the operations held in the internal register of the logic circuit block 12 are taken out (output) to be compared with expected values. Based on the result of the comparison, it is determined whether the operations of the logic circuit block 12 are correctly (adequately) performed (step S14).

According to an embodiment of the present invention, by having the configuration as described above, the test data held in the input register 2 first may be directly set in the logic circuit block 12 without being passed through the memory cell array 16. Namely, it may become possible to omit (skip) the operations in which the test data are written to the memory cell array 16 first and then, the test data are read out from the memory cell array 16. As a result, it may become possible to improve the test efficiency of the semiconductor integrated circuit device 10.

Further, in such a case where there is a fault inside the RAM core 11 of the cache memory 1, the logic circuit block 12 may not be able to receive the test data via the RAM core 11. As a result, the logic circuit block 12 may not perform the operations on the test data. In such a case, it may be difficult to determine whether the reason why the logic circuit block 12 has not performed the operations on the test data is attributed to the fault of logic circuit block 12 itself or the fault of the inside of the cache memory 1 on a route though which the test data are to be transmitted (passed) to the logic circuit block 12.

In contrast, by testing the logic circuit block 12 by directly supplying the test data held in the input register 2 to the logic circuit block 12 via the output selector 6, it may become possible to test the functions of elements of the semiconductor integrated circuit device 10 such as the logic circuit block 12 excepting the read/write control section 13 and the memory cell array 16. Because of this feature, when determining that the logic circuit block 12 correctly (adequately) performs operations upon being tested by bypassing the read/write control section 13 and the memory cell array 16 and that the logic circuit block 12 does not correctly perform operations upon being tested by writing test data in the memory cell array 16 and then reading out the test data from the memory cell array 16, it may become possible to determine that the reason why the logic circuit block 12 does not correctly perform operations is attributed to the inside of the cache memory 1.

As described above, in the semiconductor integrated circuit device 10 according to an embodiment of the present invention, it may become possible to perform the operational test of the logic circuit block 12 of the semiconductor integrated circuit device 10. Further, when there is a fault in the semiconductor integrated circuit device 10, it may be possible to determine (specify) whether the fault is in the logic circuit block 12 or in the cache memory 1.

In the following, more details of the semiconductor integrated circuit device 10 are described with reference to FIGS. 4A through 4C.

Figure 4A:
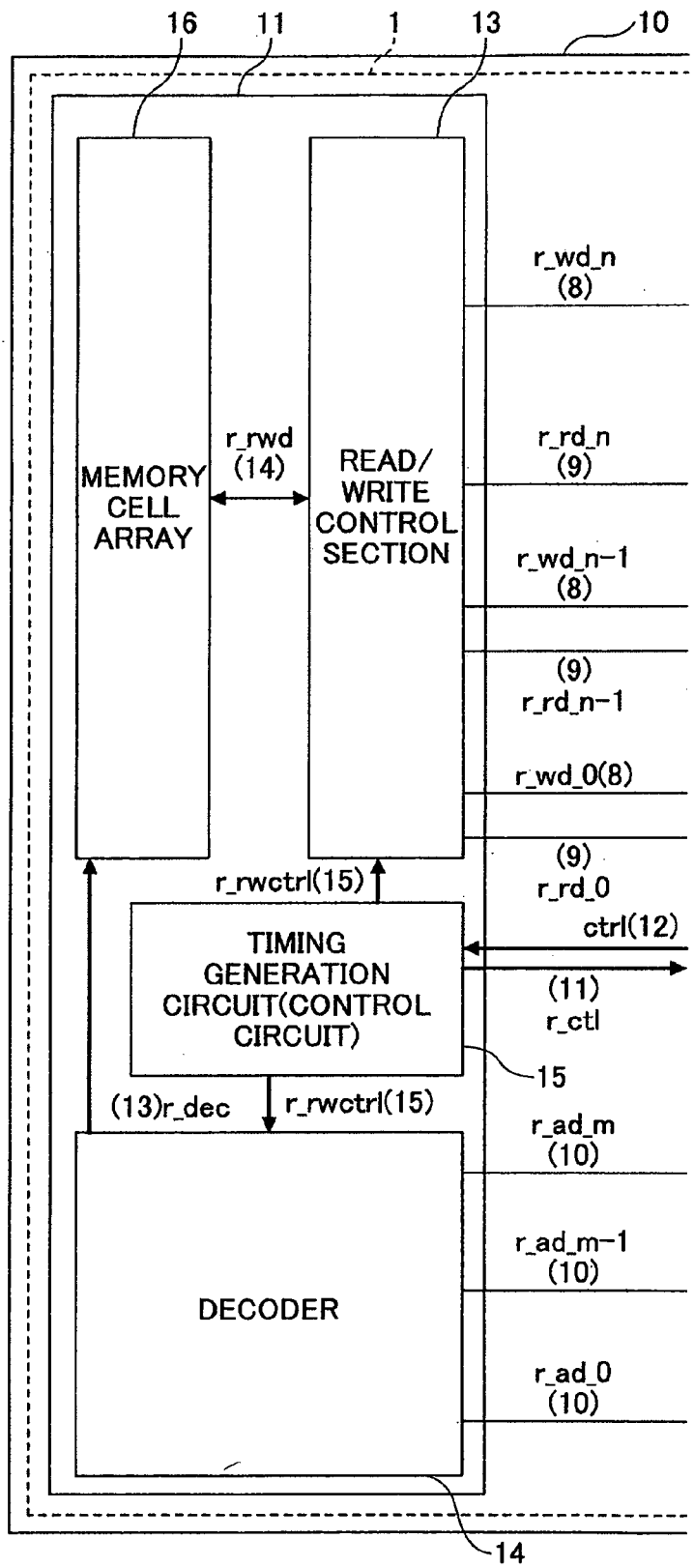
Figure 4B:
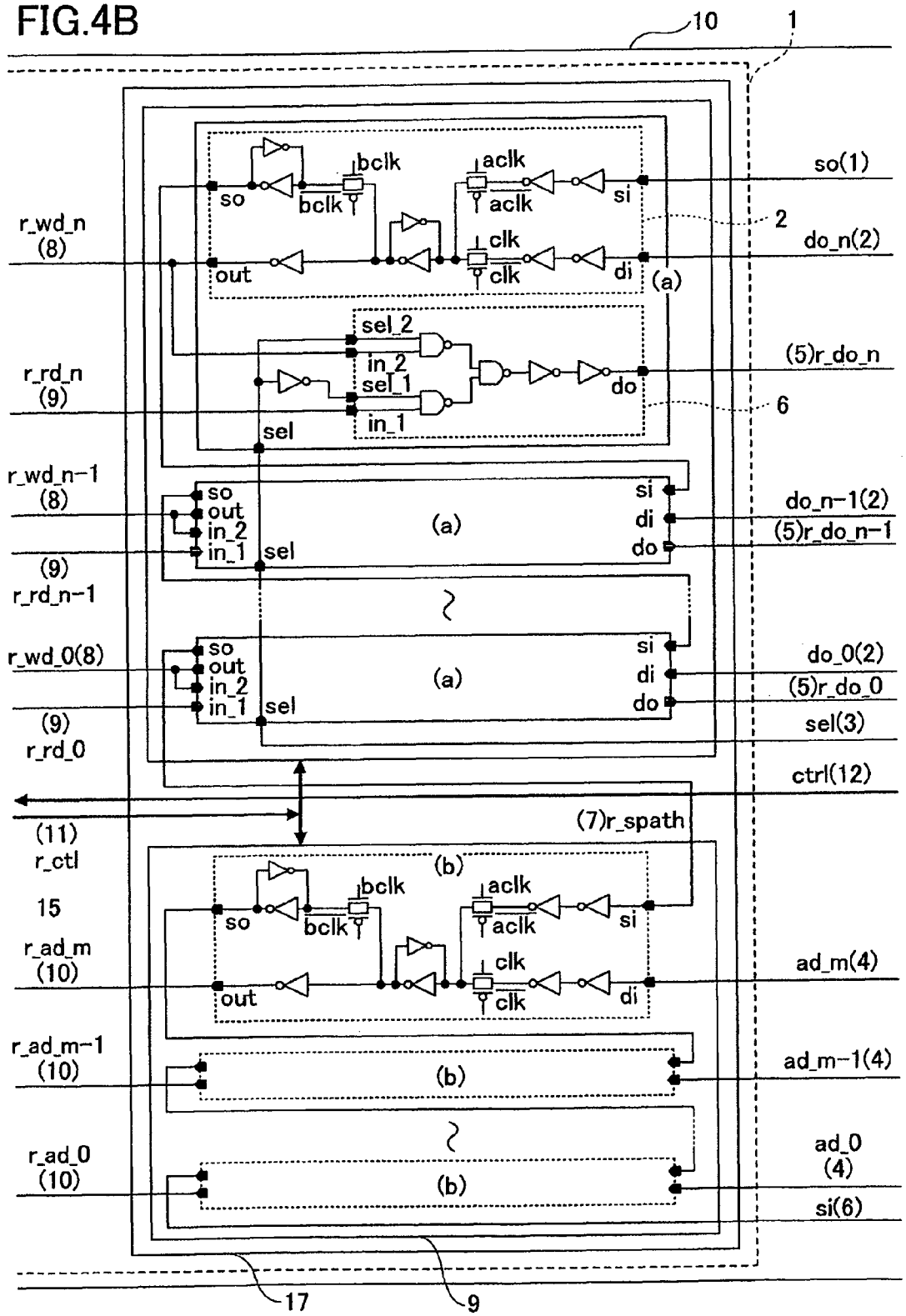

FIGS. 4A through 4C is a second block diagram collectively illustrating an exemplary schematic configuration of the semiconductor integrated circuit 10 according to an embodiment of the present invention.

As collectively illustrated in FIGS. 4A through 4C, the semiconductor integrated circuit 10 includes the logic circuit block 12 and the cache memory 1. The logic circuit block 12 processes data, and the cache memory 1 stores data under the control of the logic circuit block 12.

Further, the logic circuit block 12 includes plural logic circuits. In FIGS. 4A through 4C, the plural logic circuits are collectively represented by a logic circuit block 12-1. The logic circuit block 12 further includes a logic circuit block 12-2 having functions of, for example, directly inputting data from the cache memory 1 and processing the data (performing operations on the data). The logic circuit block 12-1 has functions of controlling the operations of the cache memory 1 to, for example, write data to the cache memory 1, the data being obtained from an external storage device or the like, read out the data from the cache memory 1 to supply the read out data to the logic circuit block 12-2, output results of the processes performed by the logic circuit block 12-2 to the outside of the semiconductor integrated circuit 10, and write the results of the processes performed by the logic circuit block 12-2 to the cache memory 1.

As collectively illustrated in FIGS. 4A through 4C, while the operations of the semiconductor integrated circuit 10 are being tested, an LSI tester 20 is directly connected to the logic circuit block 12-1. During this test, after test data are supplied from the LSI tester 20 to the logic circuit block 12-1, the logic circuit block 12-1 sets the test data in the input register 2 and the address register 9 by performing the scan shift operation. The test data input in the input register 2 may be supplied to the logic circuit block 12-2 by passing through (via) the read/write control section 13 and the memory cell array 16; otherwise, the test data input in the input register 2 may be directly supplied to the logic circuit block 12-2 by bypassing (without being passed through) the read/write control section 13 and the memory cell array 16. Then, the logic circuit block 12-2 performs operations in accordance with the supplied test data. The results of the operations of the logic circuit block 12-2 are held in an internal register (not shown), and the results of the operations in the internal register are supplied to the LSI tester 20 by performing the scan shift operation.

The cache memory 1 includes the register block 17 and the RAM core 11. The register block 17 has a function of temporarily holding the write data in the cache memory 1. The RAM core 11 controls the operations of holding, writing, and reading data.

The register block 17 includes the output selector 6, the input register 2, and the address register 9. The output selector 6 selects output data. The input register 2 holds write data. The address register 9 holds the address corresponding to the write data.

The input register 2 and the address register 9 are connected to each other in a chain-like manner. As a result, at the timing of the timing signal supplied from the timing generation circuit 15, serial data supplied from the logic circuit block 12 are transmitted to and set in the input register 2 and the address register 9 by performing the scan shift operation.

The RAM core 11 includes the decoder 14, the read/write control section 13, and the timing generation circuit (control circuit) 15. The decoder 14 has a function of selecting a cell (address) of the memory cell array 16 based on the address (address data) supplied from the address register 9. The read/write control section 13 reads and writes data from and to the selected cell (address) of the memory cell array 16. The timing generation circuit (control circuit) 15 generates timing signals to control timings of writing and reading data to and from the memory cell array 16.

Further, it is assumed that the semiconductor integrated circuit 10 can be connected with the LSI tester 20, and that, due to the function of the LSI tester 20, a known boundary scan test using test data can be performed on the semiconductor integrated circuit 10.

Further, as collectively illustrated in FIGS. 4A through 4C, the register block 17 includes plural units (a) each having the input register 2, and plural units (b) of the address register 9. More specifically, there are provided plural units (a) having similar circuit configurations to each other and connected in series with each other, each of the units (a) having the input register 2 and the output selector 6. In the same manner, as the address register 9, there are provided plural units (b) having similar circuit configuration and connected in series with each other. Further, the units (a) connected in series and the units (b) connected in series are further connected in a series with each other, each of the units (a) having the input register 2 and the output selector 6. As a result of this series connection, test data supplied as the scan input signal from the logic circuit block 12 (i.e., signal so(1) in FIGS. 4A through 4C) are input to the input register 2 of the first unit (a) through the corresponding terminal "si" and output from the input register 2 of the first unit (a) through the corresponding terminal "so". Then, the test data are input in the input register 2 of the next (second) unit (a) through the corresponding terminal "si" and output from the input register 2 of the second unit (a) through the corresponding terminal "so". This operation is sequentially repeated. In this manner, the test data are sequentially transmitted through the plural input registers 2 of the plural units (a) each having the input register 2 and the output selector 6.

Then, the test data input in the input register 2 of the final unit (a) through the corresponding terminal "si" and then output from the corresponding terminal "so" are input to the first unit (b) of the address register 9 through the corresponding terminal "si". Then, the test data are output from the terminal "so" of the first unit (b) of the address register 9, and input in the next (second) unit (b) of the address register 9 through the corresponding terminal "si" and output from the second unit (b) of the address register 9 through the corresponding terminal "so". This operation is sequentially repeated. In this manner, the test data are sequentially transmitted through the plural units (b) of the address register 9.

The scan shift operation is performed in a manner as described above, and all the test data are set in all the input registers 2 and all the units (b) of the address register 9.

Besides the terminals "si" and "so" for input and output of the test data, respectively, each of the input registers 2 further includes terminals "di" and "out". In normal operation, the terminal "di" is used to input data from the logic circuit block 12-1 to the input register 2; and the terminal "out" is used to output the data held in the input register 2 to the read/write control section 13 and the output selector 6 in the same unit (a) including the input register 2.

Whether the input through the terminal "si" or the input through the terminal "di" is to be used as the input to the input registers 2 is controlled by using control signals "aclk" and "clk" applied to respective flip-flops in FIGS. 4A through 4C. Similarly, whether the data held in the input register 2 are to be supplied by the scan shift operation to the next input register 2 is controlled by a control signal "bclk" applied to respective flip-flops in FIGS. 4A through 4C.

Namely, when the control signal "clk" is activated, the corresponding flip-flops of the input register 2 are set to pass the data supplied from the logic circuit block 12-1 to the terminal "di". As a result, the data are output from the terminal "out" of the input register 2 to be supplied to the read/write control section 13.

On the other hand, when the control signal "aclk" is activated, the corresponding flip-flops of the input register 2 are set to pass the scan input signal supplied from the logic circuit block 12-1 to the terminal "si". Further, when the control signal "bclk" is activated, the corresponding flip-flops of the input register 2 are set to further pass the scan input signal. As a result, the scan input signal is output from the terminals "so" of the input registers 2 and supplied to the corresponding next input registers 2.

Further, each of the output selectors 6 includes terminals "in_2", "in_1", and "do". The terminal "in_2" is used to input the output data from the input register 2 included in the same unit (a) as the output selector 6. The terminal "in_1" is used to input the data read out from the memory cell array 16 via the read/write control section 13. The terminal "do" is used to supply (output) data to the logic circuit block 12-2, the data being either the data input through the terminal "in_2" or the data input through the terminal "in_1".

The output selectors 6 are controlled by a control signal "sel(3)" supplied from the logic circuit block 12-1. Due to the control signal "sel(3)", each of the output selectors 6 selects either the output data from the input register 2 included in the same unit (a) as the output selector 6 or the data read out from the memory cell array 16 via the read/write control section 13, and supplies the selected data to the logic circuit block 12-2. Specifically, this selection is made by supplying the control signal "sel(3)" and inverted control signal "sel(3)" input to a first NAND gate and a second NAND gate through terminals "sel_2" and "sel_1", respectively, of the output selector 6, so that the two NAND gates produce opposite modes so as to pass (select) only one of the output data from the input register 2 or the data read out from the memory cell array 16.

As a result of the selection, when the read/write control section 13 and the memory cell array 16 are used (i.e., in a state where the output selector 6 selects the data read out from the memory cell array 16 via the read/write control section 13), the test data set in the input registers 2 by the scan shift operation are written to the memory cell array 16 first via the read/write control section 13, and then read out from the memory cell array 16 to be supplied to the logic circuit block 12-2 via the output selectors 6 in the same units (a) including the respective input registers 2. On the other hand, when the read/write control section 13 and the memory cell array 16 are bypassed (not used) (i.e., in a state where the output selectors 6 select the output data from the input registers 2 in the same units (a) including the corresponding output selectors 6, the test data set in the input registers 2 by the scan shift operation are passed through the output selectors 6 in the same units (a) including respective input registers 2 and directly supplied to the logic circuit block 12-2 without being written to the memory cell array 16 via the read/write control section 13.

Besides the terminals "si" and "so" for input and output, respectively, of the test data, each of the units (b) of the address register 9 further includes terminals "di" and "out". In normal operations, the terminal "di" is used to input address from the logic circuit block 12-1 to the unit (b) of the address register 9; and the terminal "out" is used to output the address held in the unit (b) of the address register 9 to the decoder 14.

Whether the input through the terminal "si" or the input through the terminal "di" is to be used as the input to the unit (b) of the address registers 9 is controlled by using the control signals "aclk" and "clk" applied to respective flip-flops in FIGS. 4A through 4C. Similarly, whether the data held in the unit (b) of the address register 9 are to be supplied by the scan shift operation to the corresponding next units (b) of the address register 9 is controlled by the control signal "bclk" applied to respective flip-flop in FIGS. 4A through 4C.

According to an embodiment of the present invention, there may be provided two methods of testing the operations of the semiconductor integrated circuit 10. That is, in one method (described below with reference to FIG. 5), the logic circuit block 12 is tested by using data having been passed though the read/write control section 13 and the memory cell array 16; and in the other method (described below with reference to FIG. 6), the logic circuit block 12 is tested by bypassing (without using) the read/write control section 13 and the memory cell array 16.

Figure 5:
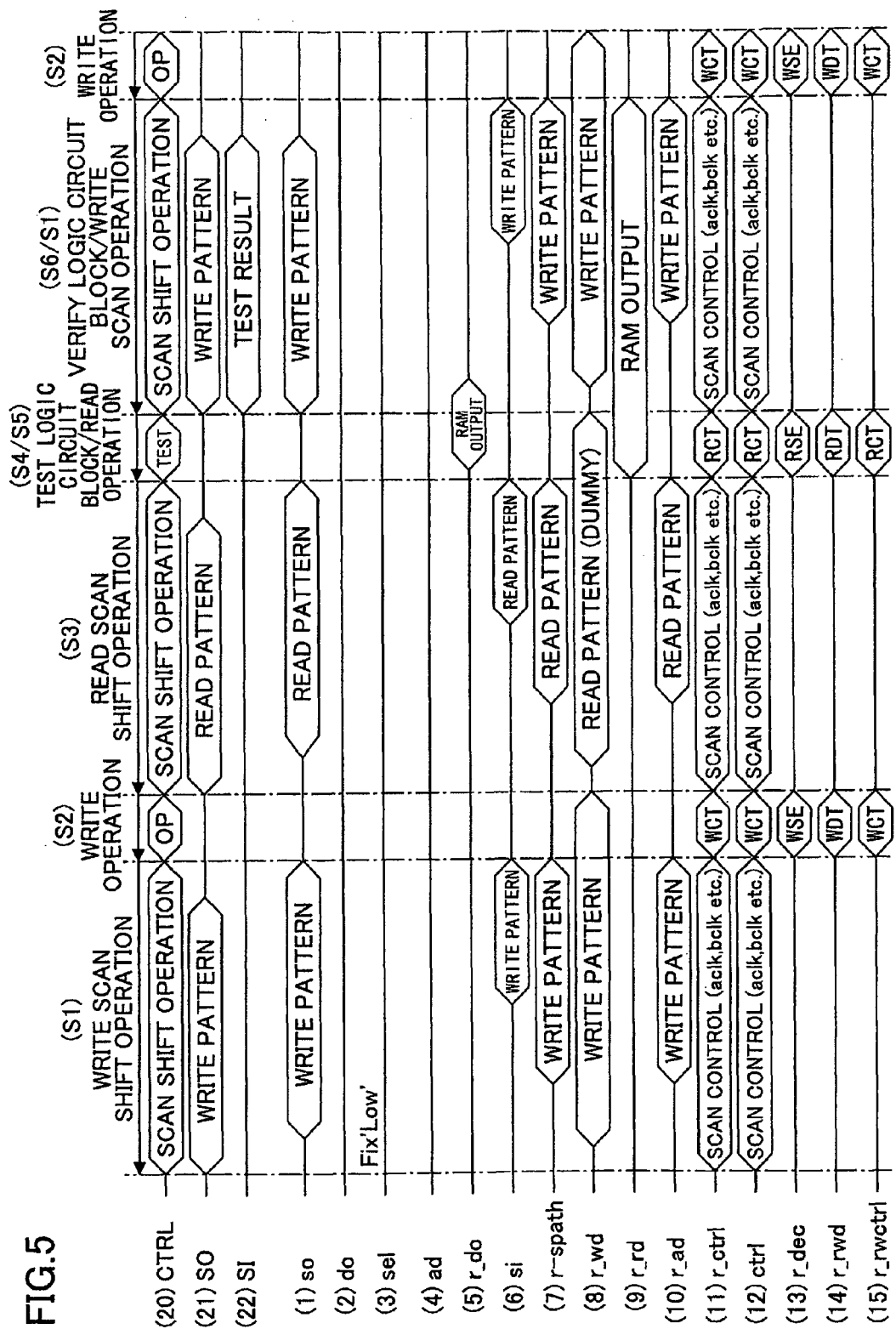
FIG. 5 is a testing time chart illustrating a case where the logic circuit block is tested by using the memory cell array in testing the semiconductor integrated circuit device.

With reference to FIGS. 4 and 5, the method is described in which the logic circuit block 12 is tested by using data having been passed though the read/write control section 13 and the memory cell array 16. The operations of step numbers S1 through S6 in FIG. 5 correspond to those in steps S1 through S6, respectively, in FIG. 3.

First, test data to be used for testing the semiconductor integrated circuit 10 are loaded into the LSI tester 20. Then, the output selectors 6 are set in a manner such that the data read out from the memory cell array 16 are supplied to the logic circuit block 12 (i.e., the level of the control signal "sel(3)" is set low). To that end, the LSI tester 20 controls the logic circuit block 12-1 of the semiconductor integrated circuit 10 using a control signal "CTRL(20)".

Next, in the state described above, the scan shift operation is performed to write data (step S1 in FIG. 5).

In the scan shift operation to write data, the logic circuit block 12-1 is controlled by an output signal "TDO(21)" and a control signal "CTRL(20)", so that consecutive write test data are output (supplied) to the cache memory 1.

Namely, the logic circuit block 12-1 transmits a control signal "ctrl(12)" to the timing generation circuit 15 to control the timing generation circuit 15. As a result of this control, the timing generation circuit 15 outputs a control signal "r_ctrl(11)", and the control signal "r_ctrl(11)" controls the operations of the input registers 2 and the address registers 9. This control signal "r_ctrl(11)" includes the controls signals "clk", "aclk", and "bclk".

In this case, the write test data are transmitted as the scan input signal "so(1)" to the input register 2; and then, by performing the scan shift operation, the write test data are set in all the input registers 2 and the address registers 9. The write test data are transmitted to the address registers 9 as a signal "r_spath(7)" and further transmitted as the scan output signal to logic circuit block 12-1 as a signal "si(6)".

After the completion of the setting of the write test data in the input registers 2 and the address registers 9 by the scan shift operation (step S1 in FIG. 5), the write operation is performed (step S2 in FIG. 5).

In this write operation, the LSI tester 20 controls the logic circuit block 12-1 of the semiconductor integrated circuit 10 by using the control signal "CTRL(20)". As a result of this control, the logic circuit block 12-1 controls the timing generation circuit 15 of the cache memory 1 by using the control signal "r_ctrl(11)". Due to this control signal "r_ctrl(11)", the operations of the input registers 2 and the address registers 9 are controlled. As described above, the control signal "r_ctrl(11)" includes the controls signals "clk", "aclk", and "bclk".

In this case, the cache memory 1 is controlled by the logic circuit block 12-1, and the timing generation circuit 15 generates the timing signals to control timings used in the write operation. Further, the timing generation circuit 15 controls the decoder 14 by using a control signal "r_rwctrl(15)", so that the address "r_ad(10)" held in the address registers 9 and included in the write test data are decoded. Then, via the read/write control section 13, the test data set in the input registers 2 are written to a cell of the memory cell array 16, the cell being selected based on the decoded result by the decoder 14.

After the completion of the write operation (step S2 in FIG. 5), similar to the scan shift operation with respect to the write test data in step S1, another scan shift operation is performed for read test data (step S3 in FIG. 5).

Then, the read operation is performed on the cache memory 1 (step S4 in FIG. 5). In this read operation, similar to the write operation, the address which is set in the address registers 9 as the read test data by the scan shift operation (step S3) is decoded by the decoder 14, and the cell to which the data have been written by the write operation is designated by the decoded address, so that the data are read out from the cell of the memory cell array 16.

As a result, the test data written in the memory cell array 16 in step S2 are transmitted (supplied) to the logic circuit block 12-2, and the logic circuit block 12-2 performs operations on the transmitted test data. By doing this way, the operations of the logic circuit block 12-2 may be tested (step S5 in FIG. 5).

Finally, similar to the scan shift operation on the write test data in step S1, by performing the scan shift operation, the data that are the results of the operations of the logic circuit block 12-2 and that are held in the internal register (not shown) of the logic circuit block 12-1 are read out as a signal "TDI(22)", and are supplied to the LSI tester 20 (step S6 in FIG. 5). In the LSI tester 20, the data of the results of the operations are compared with expected values. By doing this way, the operations of the logic circuit block 12 are tested.

Next, a case is described where the functions (operations) of the logic circuit block 12-2 are tested using plural test data. In this case, first, the output selectors 6 are set in a manner such that the data read out from the read/write control section 13 in the cache memory 1 are supplied to the logic circuit block 12-2. To that end, the level of the control signal "sel(3)" illustrated in FIGS. 4A through 4C is set low.

Then, the logic circuit block 12-1 is controlled so that the scan shift operation on the write test data is performed. As a result, the write test data are set in the input registers 2 and the address registers 9 (step S1). Then, the logic circuit block 12-1 is further controlled so that the write operation is performed to write the write test data in the cache memory 1 (step S2).

Next, another scan shift operation is performed for the read test data so that the read test data are set in the input registers 2 and the address registers 9 (step S3). Then, the read operation is performed on the cache memory 1 (step S4).

By doing this read operation, the test data are transmitted to the logic circuit block 12-2, and then, the logic circuit block 12-2 performs the operations on the transmitted (received) test data (step S5).

Finally, the results of the operations of the logic circuit block 12 are read out from the internal register (not shown) in the logic circuit block 12-1 by performing the scan shift operation, and transmitted to the LSI tester 20 (step S6). In the LSI tester 20, the data of the results of the operations are compared with expected values. By doing this way, the operations of the logic circuit block 12 are tested (verified). At the same time, the next of the write test data is set (step S1).

By repeating those processes (i.e., scan shift operation for transmitting write test data and test results (steps S1 and S6), the write operation (step S2), the scan shift operation for read test data (step S3), and the read operation and the test operation (steps S4 and S5)) plural times, the functions (operations) of the logic circuit block 12-2 may be tested using the plural test data.

In FIGS. 5 and 6, some functions of the signals are simplistically symbolized. Specifically, in the figures, symbols WCT, WSE, WDT denote write control, write selection, write data, respectively; symbols RCT, RSE, RDT denote read control, read selection, read data, respectively; and symbols OP and BO denote operation and bypass output, respectively.

Next, a method of testing the logic circuit block 12 by bypassing (without using) the read/write control section 13 and the memory cell array 16 is described with reference to FIGS. 4 and 6. The operations of step numbers S11 through S14 in FIG. 6 correspond to those in steps S11 through S14, respectively, in FIG. 3.

In this case as well, it is assumed that test data to be used for testing the semiconductor integrated circuit 10 have been already loaded in the LSI tester 20.

Further, the output selector 6 is set in a manner such that the test data bypass (do not pass through) the read/write control section 13 and the memory cell array 16 and are directly supplied to the logic circuit block 12. To that end, by using the control signal "CTRL(20)", the LSI tester 20 controls the logic circuit block 12-1 so that the level of the control signal "sel(3)" output from the logic circuit block 12-1 is low.

In the state described above, the test data are set in the input registers 2 by performing the scan shift operation (step S11 in FIG. 6). More specifically, the test data are transmitted as the input signal "so(1)" to the input registers 2 of the cache memory 1 by performing the scan shift operation, and are held in the input registers 2. Then the test data output from the input registers 2 are transmitted to the logic circuit block 12-2 via the output selector 6 (step S12 in FIG. 6). This operation may be regarded as the write operation of writing the data held in the input registers 2 to the logic circuit block 12-2 via the output selector 6. Upon receiving the test data, the logic circuit block 12-2 performs operations on the received test data. By doing this way, the operations of the logic circuit block 12 may be tested (step S13 in FIG. 6). The results of the operations are output from the logic circuit block 12-2 and held in the internal register (not shown) in the logic circuit block 12-1.

Finally, the results of the operations are started to be read out from the internal register in the logic circuit block 12-1, and another scan shift operation is performed to set the next test data in the input registers 2 (steps S14 and S11). By doing this way, the read out of the results of the operations and the setting of the next test data may be performed simultaneously.

The results of the operations read out from the internal register of the logic circuit block 12-1 are transmitted as the signal "TDI(22)" to the LSI tester 20. Then, in the LSI tester 20, the results of the operations are compared with expected values. By doing this way, the operations of the logic circuit block 12 are tested (verified).

In a case where the functions (operations) of the logic circuit block 12-2 are tested using plural patterns (test data), the scan shift operation to set the next test data and read out the results of the operations of the logic circuit block 12-2 (steps S11 and S14), and the testing operation and the write operation to write test data to the logic circuit block 12-2 (steps S12 and S13) may be repeated plural times.

The present invention, however, is not limited to the configuration (method) as described above. For example, in a case where the test data to be used for testing the logic circuit block 12-2 are directly supplied to the logic circuit block 12-2 by bypassing (without passing through) the read/write control section 13 and the memory cell array 16, it may be controlled so that the same test data are simultaneously written to the memory cell array 16 via the read/write control section 13 as well as to the logic circuit block 12-2.

In this case, after the operations of the logic circuit block 12-2 are tested based on the operations performed by the logic circuit block 12-2 using the test data directly supplied to the logic circuit block 12-2 by bypassing (without passing through) the read/write control section 13 and the memory cell array 16, the same data having been written to the memory cell array 16 via the read/write control section 13 as described above may be read out from the memory cell array 16 and supplied to the logic circuit block 12-2. Then, the operations of the logic circuit block 12-2 may further be tested based on the operations performed by the logic circuit block 12-2 on the test data supplied to the logic circuit block 12-2, the test data having been passed through the read/write control section 13 and the memory cell array 16.

By having such a configuration, it may become possible to carry out the following two tests in a short time period. One is to test the operations of the logic circuit block 12-2 regardless of the writing and reading operations for the cache memory 1 by bypassing (without using) the read/write control section 13 and the memory cell array 16; and the other is to test the operations of the logic circuit block 12-2 including the writing and reading operations for the cache memory 1 by using the read/write control section 13 and the memory cell array 16. As a result, it may become possible to reduce the testing time.

Further, by comparing the results between the case where the read/write control section 13 and the memory cell array 16 are used and the case where the read/write control section 13 and the memory cell array 16 are bypassed (not used), if the test result is faulty only in the case where the read/write control section 13 and the memory cell array 16 are used, it may become possible to determine that the cause of the fault is related to the write operation or the read operation or both for the cache memory 1.

Further, the scan test described above is a standard test simplification design approach proposed by JTAG (Joint Test Action Group), and was standardized as IEEE 1149.1 in 1990. This standard was originally designed for testing boards such as printed-circuit boards and is now used not only in testing boards but also LSI circuits with the growth of their scale.

According to an embodiment of the present invention, there is provided a semiconductor integrated circuit device including a logic circuit, a memory circuit to which data are written by the logic circuit and from which the data are read by the logic circuit, a register circuit holding the data when the logic circuit writes the data to the memory circuit, and a selector circuit selecting one of data output from the register circuit and data output from the memory circuit, and outputting the selected data to the logic circuit. Further, in the semiconductor integrated circuit device, in an operational test of the logic circuit, the selector circuit selects the data output from the register circuit and outputs the selected data to the logic circuit. By doing this way, the data to be used for testing the operations of the logic circuit may be held in the register circuit and the operational test of the logic circuit may be performed by using the data held in the register circuit, the data being to be used for testing the operations of the logic circuit.

According to an embodiment of the present invention, as described above, the data to be used for testing the operations of the logic circuit are held in the register circuit first; and then, the operational test of the logic circuit is performed by using the data to be used for testing the operations held in the register circuit. Namely, the data to be used for testing the operations held in the register circuit are directly supplied to the logic circuit without being passed through the memory circuit. Then, the logic circuit performs operations on the input data, and by obtaining the results of the operations of the logic circuit, it may become possible to test (verify) the operations of the logic circuit.

According to the configuration described above, without performing conventionally required processes of (1) writing the data to the memory circuit, the data being to be used for testing the operations and being held in the register, and (2) reading out the data to be used for testing the operations written in the memory circuit and supplying the read out data to the logic circuit, the data to be used for testing the operations held in the register circuit may be directly supplied to the logic circuit so that the operational test of the logic circuit may be performed by using the data to be used for testing the operations held in (and directly supplied from) the register circuit.

As a result, the procedure of supplying the data to be used for testing the operations to the logic circuit may be simplified. Because of this feature, it may become possible to effectively reduce the testing time required to test the semiconductor integrated circuit device. Further, as described above, the data to be used for testing the operations may be directly supplied from the register circuit to the logic circuit. Because of this feature, even if the memory circuit itself is faulty, the operational test of the logic circuit may be adequately performed.

According to an embodiment of the present invention, there may be provided a semiconductor integrated circuit device having the function to be effectively tested and a testing method of the same.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that various changes, substitutions, and alterations could be made hereto without departing from the spirit and scope of the invention.

What is claimed is:

1. A semiconductor integrated circuit device comprising:
a logic circuit;
a memory circuit to which data are written by the logic circuit and from which the data are read by the logic circuit;
a register circuit configured to hold the data when the logic circuit writes the data to the memory circuit; and
a selector circuit configured to select one of data output from the register circuit and data output from the memory circuit, and output the selected data to the logic circuit, wherein
in an operational test of the logic circuit, the selector circuit selects the data output from the register circuit and outputs the selected data to the logic circuit.

2. The semiconductor integrated circuit device according to claim 1, wherein
data to be used for the operational test are set in the register circuit by performing a scan shift operation.

3. The semiconductor integrated circuit device according to claim 1, wherein
the selector circuit selects the data output from the memory circuit,
the data to be used for the operational test held in the register circuit are written to the memory circuit, and
the operational test of the logic circuit is performed by using the data to be used for the operational test.

4. The semiconductor integrated circuit device according to claim 1, wherein
the memory circuit comprises a cache memory.

5. A method of testing a semiconductor integrated circuit device, the semiconductor integrated circuit device including:
a logic circuit;
a memory circuit to which data are written by the logic circuit and from which the data are read by the logic circuit; and
a register circuit configured to hold the data when the logic circuit writes the data to the memory circuit, the method of testing the semiconductor integrated circuit device comprising:
holding data to be used for the operational test in the register circuit;
inputting the data to be used for the operational test held in the register circuit to the logic circuit; and
testing operations of the register circuit by using the input data to be used for the operational test.

6. The method of testing a semiconductor integrated circuit device according to claim 5, wherein
the data to be used for the operational test are set in the register circuit by performing a scan shift operation.

7. The method of testing a semiconductor integrated circuit device according to claim 5, further comprising:
writing the data to be used for the operational test held in the register circuit to the memory circuit;
reading the data to be used for the operational test from the memory circuit, the data being written to the memory circuit; and
testing the operations of the register circuit by using the data to be used for the operational test, the data being read from the memory circuit.

8. The method of testing a semiconductor integrated circuit device according to claim 5, wherein
the memory circuit comprises a cache memory.

* * * * *